(12) United States Patent
Nakamura et al.

(10) Patent No.: US 6,971,571 B2
(45) Date of Patent: Dec. 6, 2005

(54) REFLOW SOLDERING APPARATUS AND REFLOW SOLDERING METHOD

(75) Inventors: Naoaki Nakamura, Kawasaki (JP); Osamu Higashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 15 days.

(21) Appl. No.: 10/461,370

(22) Filed: Jun. 16, 2003

(65) Prior Publication Data
US 2003/0213833 A1 Nov. 20, 2003

Related U.S. Application Data

(63) Continuation of application No. PCT/JP00/09108, filed on Dec. 21, 2000.

(51) Int. Cl.[7] .............................. B23K 31/02; F27B 9/02
(52) U.S. Cl. ..................... 228/233.2; 228/43; 432/128; 432/171
(58) Field of Search ............................. 228/234.2, 6.2, 228/42, 43, 56.1, 233.2; 432/128, 129, 171, 432/163, 169

(56) References Cited

U.S. PATENT DOCUMENTS

| | | | | |
|---|---|---|---|---|
| 4,155,965 A | * | 5/1979 | Allada | 264/416 |
| 4,612,712 A | * | 9/1986 | Pescatore et al. | 34/68 |
| 4,830,263 A | * | 5/1989 | Dexheimer | 228/180.1 |
| 4,874,124 A | * | 10/1989 | Johns et al. | 228/180.1 |
| 5,044,944 A | * | 9/1991 | Furuya et al. | 432/128 |
| 5,538,008 A | * | 7/1996 | Crowe | 600/564 |
| 5,579,981 A | * | 12/1996 | Matsumura et al. | 228/19 |
| 6,386,422 B1 | * | 5/2002 | Cheng et al. | 228/46 |

FOREIGN PATENT DOCUMENTS

| | | |
|---|---|---|
| EP | 0 217 588 | 4/1987 |
| JP | 61-82965 | 4/1986 |
| JP | 62-64475 | 3/1987 |
| JP | 63-30172 | 2/1988 |
| JP | 1-112721 | 5/1989 |
| JP | 6-21644 | 1/1994 |
| JP | 6-61640 | 3/1994 |
| JP | 6-79447 | 3/1994 |
| JP | 6-188556 | 7/1994 |
| JP | 6-320260 | 11/1994 |
| JP | 7-44824 | 2/1995 |
| JP | 7-87987 | 9/1995 |

(Continued)

*Primary Examiner*—Kiley S. Stoner
(74) *Attorney, Agent, or Firm*—Westerman, Hattori, Daniels & Adrian, LLP

(57) ABSTRACT

A bath apparatus 12 reserves a liquid 13 as a heating medium and includes an input partition bath 31, a first intermediate partition bath 32, a heat partition bath 33, a second intermediate partition bath 34 and a removing partition bath 35 that are divided by gates 21 through 24 and sequentially arranged in a direction in which a printed board assembly where components are loaded onto a printed board moves. The temperatures of liquids 13-31 and 13-32 in the input partition bath 31 and the first partition bath 32 are a preheating temperature. The temperature of a liquid 13-33 in the heat partition bath 33 is a soldering temperature. The gate 21 is gradually opened while the printed board assembly 11 is located in the first intermediate partition bath 32 and before the printed board assembly 11 is conveyed into the heat partition bath 33. The liquid in the heat partition bath 33 is mixed with the liquid in the first intermediate partition bath 32, and thus the temperature of the first intermediate partition bath 32 is gradually increased to the soldering temperature. The temperature of the printed board assembly 11 is gradually increased from the preheating temperature to the soldering temperature.

10 Claims, 5 Drawing Sheets

FOREIGN PATENT DOCUMENTS

| | | |
|---|---|---|
| JP | 7-273442 | 10/1995 |
| JP | 2625918 | 4/1997 |

* cited by examiner

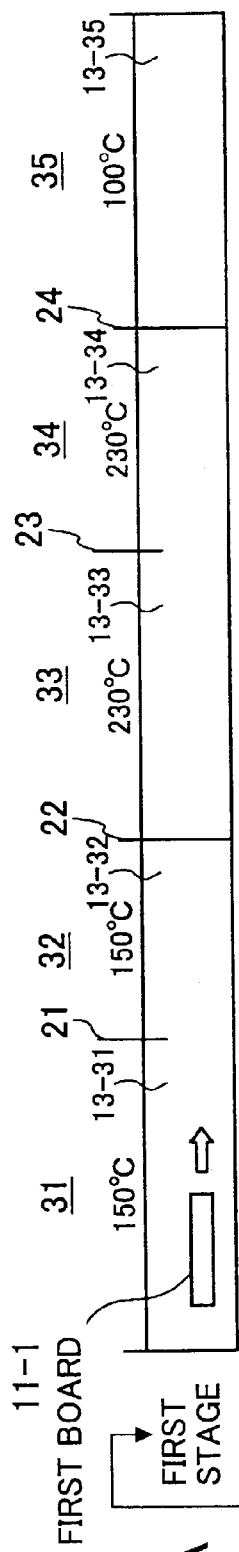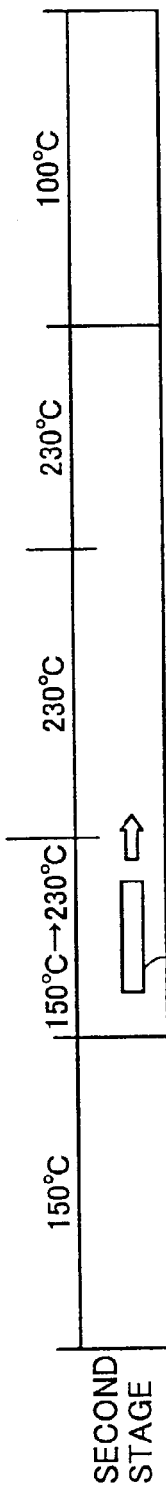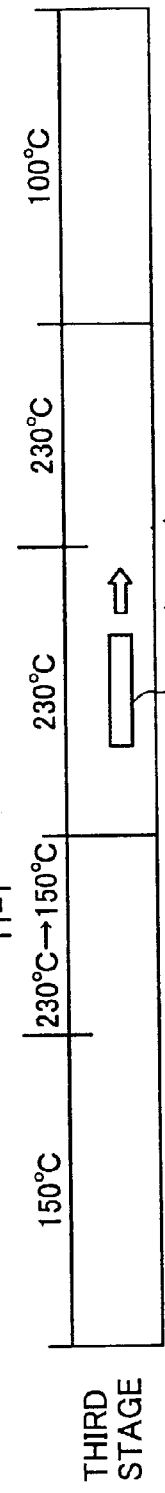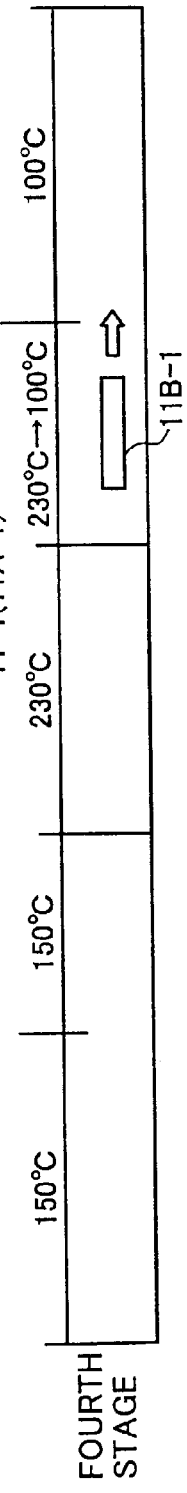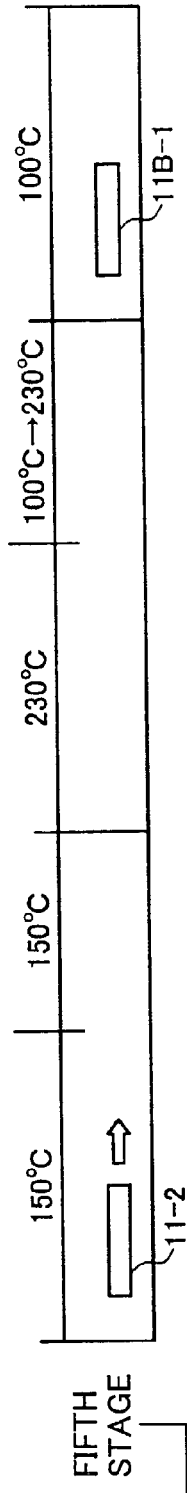

FIG.4

|  | FIRST STAGE | SECOND STAGE | THIRD STAGE | FOURTH STAGE | FIFTH STAGE |
|---|---|---|---|---|---|
| STATE OF GATE 21 | Open | Open→Close | Close→Open | Open | Open |
| STATE OF GATE 22 | Close | Close→Open | Open→Close | Close | Close |
| STATE OF GATE 23 | Open | Open | Open | Open→Close | Close→Open |
| STATE OF GATE 24 | Close | Close | Close | Close→Open | Open→Close |
| TEMPERATURE OF INPUT PARTITION BATH 31 | pre1 | pre1 | pre1 | pre1 | pre1 |
| TEMPERATURE OF FIRST INTERMEDIATE PARTITION BATH 32 | pre1 | pre1→Peak | Peak→pre1 | pre1 | pre1 |
| TEMPERATURE OF HEAT PARTITION BATH 33 | Peak | Peak | Peak | Peak | Peak |
| TEMPERATURE OF SECOND INTERMEDIATE PARTITION BATH 34 | Peak | Peak | Peak | Peak→pre2 | pre2→Peak |
| TEMPERATURE OF REMOVING PARTITION BATH 35 | pre2 | pre2 | pre2 | pre2 | pre2 |

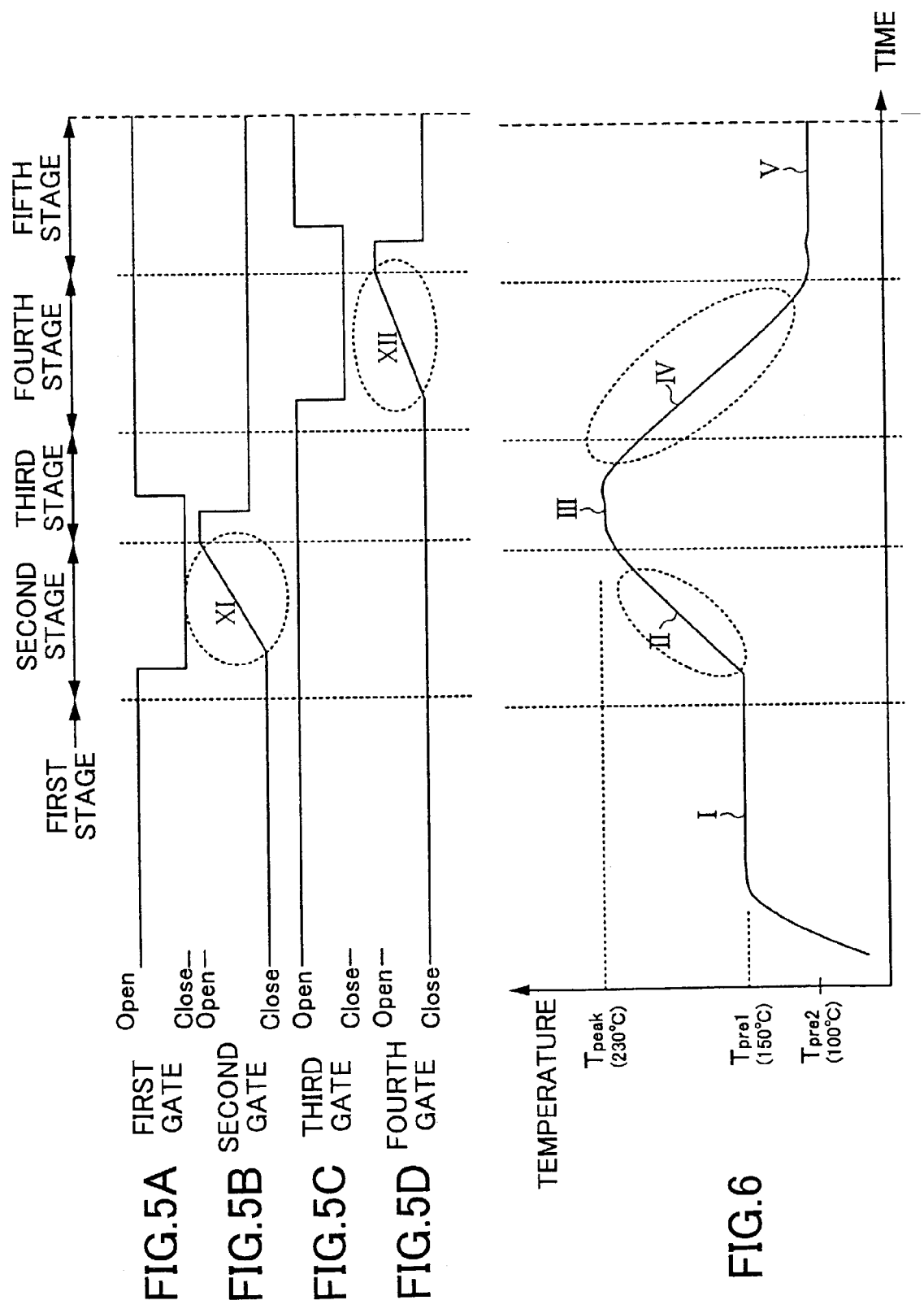

REFLOW SOLDERING APPARATUS AND REFLOW SOLDERING METHOD

This application is a continuation of PCT/JP00/09108 filed Dec. 21, 2000.

TECHNICAL FIELD

The present invention relates to reflow soldering apparatuses and reflow soldering methods, and more particularly, to a reflow soldering apparatus and reflow soldering method performing reflow soldering on an electronic component loaded-printed board assembly where a surface-mounted electronic component is loaded on a printed board coated with a cream solder so as to produce an electronic component mounted-printed board assembly on which an electronic component is mounted.

Generally, in a printed board unit where a plurality of electronic components are soldered to a printed board, electronic components having large heat capacities and electronic components having small heat capacities are mixed. Accordingly, it is preferable that the reflow soldering apparatus be capable of corresponding to it, that is, capable of having the electronic components having the large heat capacities and the electronic components having small heat capacities be soldered at the same time.

In addition, it is preferable that the reflow soldering apparatus be capable of freely defining temperature profile in heating the electronic component loaded-printed board assembly to a soldering temperature. This is for suitably determining the peak temperature of reflow soldering so as to make heat stress generated in the electronic components and printed board in heating be as small as possible. Here, heat stress refers to mechanical stress generated in the electronic components and the like by heat due to the differences among the thermal expansion coefficients of the electronic components, printed board and solder.

BACKGROUND ART

Reflow soldering apparatuses that perform reflow soldering on an electronic component mounted-printed board assembly where an electronic component is mounted on a printed board coated with a cream solder are classified broadly into infrared reflow soldering apparatuses equipped with an infrared heating apparatus and saturated vapor reflow soldering apparatuses equipped with a saturated vapor heating apparatus.

The infrared heating apparatus is equipped with an infrared ray irradiating apparatus and performs heating by using radiant heat of the infrared rays. Thus, in the infrared reflow soldering apparatus, it is possible to appropriately determine the temperature profile in heating to a soldering temperature by suitably adjusting the infrared ray irradiating apparatus. However, since the heating uses the radiant heat of the infrared rays, heating of electronic components having small heat capacities proceeds, while heating of electronic components having large heat capacities is delayed. Hence, it is impossible to heat the large heat capacity electronic components and the small heat capacity electronic components uniformly. When heating conditions of the infrared ray irradiating apparatus are matched to the large heat capacity electronic components, the small heat capacity electronic components may be heated excessively to a temperature above the heat-resistance temperature. In this case, it is impossible to simultaneously perform reflow soldering on the small heat capacity electronic components and the large heat capacity electronic components. Thus, the small heat capacity electronic components are separately mounted afterward, and the productivity of the electronic component mounted-printed board assembly is not good.

The saturated vapor heating apparatus performs heating by saturated vapor obtained by heating a fluorinated inert liquid to boiling. Accordingly, it is possible for the saturated vapor reflow soldering apparatus to uniformly heat the large heat capacity electronic components and the small heat capacity electronic components. However, since the temperature of the saturated vapor is determined by the kind of the inert liquid to be used, the peak temperature in reflowing cannot be adjusted. In addition, it is impossible to suitably define the temperature profile in heating the electronic component loaded-printed board assembly to the soldering temperature. Generally, the heating in such a case becomes sudden heating, and the reliability of the electronic components and the printed board is adversely affected by the sudden thermal expansion.

DISCLOSURE OF THE INVENTION

It is a general object of the present invention to provide a reflow soldering apparatus and reflow soldering method that can uniformly heat large heat capacity electronic components and small heat capacity electronic components and also suitably define the temperature profile in heating an electronic component loaded-printed board assembly to a soldering temperature, in which the above-described problems are eliminated.

In order to achieve the object, the present invention includes a bath apparatus reserving a liquid as a heating medium and divided into a plurality of partition baths by gates, the liquid in one of the partition baths being heated to a preheating temperature, the liquid in another one of the partition baths being heated to a soldering temperature, and is configured to convey a printed board assembly in which components are loaded onto a printed board through the plurality of partition baths in sequence so as to solder the components to the printed board by a reflow method.

Compared with a gas used as a heating medium in the VPS (Vapor Phase Soldering) method and hot gas method, liquid possesses a large heat capacity. Accordingly, the increase in temperature of the liquid with respect to a unit quantity of heat applied to the liquid is small. Hence, it is possible to perform delicate temperature control.

In addition, the temperature at which the liquid is vaporized is determined according to the kind of the liquid. Hence, when a gas is used as the heating medium, certain limitations are put on the temperature control. On the other hand, when the heating medium is liquid, the temperature control is possible in a wide range and is hardly dependent on the kind of liquid. Thus, free temperature setting is possible.

Further, in order to achieve the above-described object, the present invention provides a reflow soldering apparatus having a bath apparatus that reserves a liquid as a heating medium and is divided into a plurality of partition baths by gates, the liquid in one of the partition baths being heated to a preheating temperature, the liquid in another one of the partition baths being heated to a soldering temperature, and conveying a printed board assembly in which components are loaded on a printed board through the partition baths in sequence so as to solder the components to the printed board by a reflow method, including:

a first partition bath reserving the liquid heated to the preheating temperature;

a second partition bath reserving the liquid heated to the soldering temperature;

a first gate between the first partition bath and the second partition bath; and a first gate opening part gradually opening the first gate before conveying the printed board assembly from the first partition bath to the second partition bath so as to gradually increase the temperature of the liquid in the first partition bath where the printed board assembly is located by mixing the liquid heated to the soldering temperature in the second partition bath therewith.

Since liquid is used as the heating medium, it is possible to uniformly heat large heat capacity electronic components and small heat capacity electronic components.

By gradually opening the first gate, the liquid heated to the soldering temperature in the second partition bath is gradually mixed with the liquid in the first partition bath. Thus, the temperature of the liquid in the first partition bath is gradually increased, and the temperature of the printed board assembly is gradually increased from the preheating temperature to the soldering temperature.

Additionally, in order to achieve the above-described object, the present invention provides a reflow soldering method soldering components to a printed board by a reflow method through using a bath apparatus that reserves a liquid as a heating medium and is divided into a plurality of baths by gates, the liquid in one of the baths being heated to a preheating temperature, the liquid in another one of the baths being heated to a soldering temperature, and through sequentially conveying a printed board assembly where the component is loaded onto the printed board through the plurality of baths, wherein, before the printed board assembly is conveyed from the bath that reserves the liquid heated to the preheating temperature to the bath that reserves the liquid heated to the soldering temperature, the gate is gradually opened so as to increase the temperature of the liquid in the bath where the printed board assembly is located by mixing the liquid heated to the soldering temperature therewith.

Since liquid is used as the heating medium, it is possible to uniformly heat large heat capacity electronic components and small heat capacity electronic components.

By gradually opening the first gate, the liquid heated to the soldering temperature in the second partition bath is gradually mixed with the liquid in the first partition bath. Thus, the temperature of the liquid in the first partition bath is gradually increased, and the temperature of the printed board assembly is gradually increased from the preheating temperature to the soldering temperature.

BRIEF DESCRIPTION OF THE DRAWINGS

FIGS. 3A through 3E are diagrams for explaining a reflow soldering operation of the reflow soldering apparatus in FIG. 1;

FIG. 4 is a table displaying the states shown in FIGS. 3A through 3E;

FIGS. 5A through 5D are diagrams showing open and close operations of gates in the reflow soldering operation of the reflow soldering apparatus in FIG. 1; and FIG. 6 is a diagram showing a profile of temperature of a printed board in the reflow soldering operation.

BEST MODE FOR CARRYING OUT THE INVENTION

A description will be given of a preferred embodiment of the present invention, with reference to the drawings.

Figure 1:
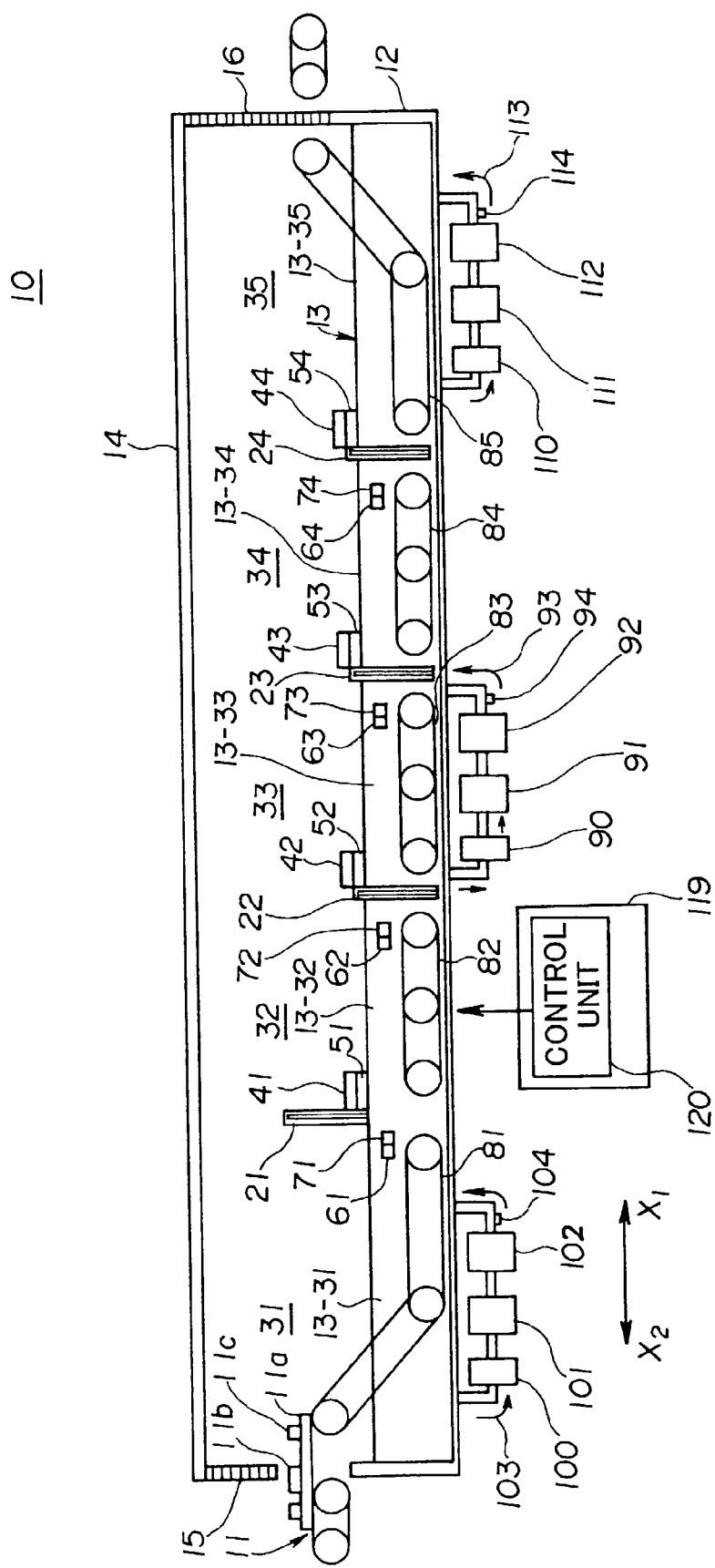
FIG. 1 is a diagram showing a reflow soldering apparatus according to one embodiment of the present invention.

FIG. 1 shows a reflow soldering apparatus 10 according to one embodiment of the present invention. X1 indicates the direction in which an electronic component loaded-printed board assembly 11 is moved.

12 denotes a bath apparatus that is long in X1–X2 directions and reserves an inert liquid 13 as a heating medium. The inert liquid 13 is, for example, Galden HS260 of AUSIMONT having the boiling point of 260° C., which is a temperature higher than the soldering temperature. The electronic component loaded-printed board assembly 11 is not oxidized or the like during reflow soldering since the inert liquid 13 is used. The bath apparatus 12 is entirely covered with a cover 14 to form a tunnel-like shape and includes a carry-in door 15 and a carry-out door 16 that open and shut.

The bath apparatus 12 is divided into a plurality of partition baths by a plurality of gates 21 through 24. The plurality of partition baths are constituted by, in the order along the direction from X2 to X1, an input partition bath 31, a first intermediate partition bath 32, a heat partition bath 33, a second intermediate partition bath 34, and a removing partition bath 35. 13-31 denotes an inert liquid in the input partition bath 31, 13-32 denotes an inert liquid in the first intermediate partition bath 32, 13-33 denotes an inert liquid in the heat partition bath 33, 13-34 denotes an inert liquid in the second intermediate partition bath 34, and 13-35 denotes an inert liquid in the removing partition bath 35.

The input partition bath 31 serves to preheat the electronic component loaded-printed board assembly 11. The heat partition bath 33 serves to heat the electronic component loaded-printed board assembly 11 from a preheating temperature to the soldering temperature. The removing partition bath 35 serves to once cool the printed board assembly to which electronic components are soldered and mounted down to 100° C. before dispatching the printed board assembly into the atmosphere. The first intermediate partition bath 32 is located between the input partition bath 31 and the heat partition bath 33, serves as a reserve bath for the heat partition bath 33, and also serves to gradually heat the electronic component loaded-printed board assembly 11 to the soldering temperature without influencing the input partition bath 31. The second intermediate partition bath 34 is located between the heat partition bath 33 and the removing partition bath 35, serves as a reserve bath for the removing partition bath 35, and also serves to gradually cool an electronic component solder mounted printed board down to 100° C. without influencing the heat partition bath 33.

For the sake of convenience of illustration, each of the partition baths 31 through 35 is shown as being the same size. However, the first intermediate partition bath 32 and the second intermediate partition bath 34 are slightly larger than the electronic component loaded-printed board assembly 11. The input partition bath 31, the heat partition bath 33 and the removing partition bath 35 are four to five times as large as the intermediate partition baths 32 and 33. This is for facilitating an operation of controlling the temperature of the inert liquids 13 in the intermediate partition baths 32 and 33 according to the open states of the gates, which will be described later.

In association with each of the gates 21 through 24, actuators 41 through 44 that open and close the gates and gate open position sensors 51 through 54 that detect open positions of the gates 21 through 24 are provided.

The input partition bath 21 is provided with a printed board sensor 61 detecting that the printed board 11 is conveyed in and a temperature sensor 71 detecting the temperature of the inert liquid 13 in the input partition bath 21 at positions close to the gate 21.

The first intermediate partition bath 32 is provided with a printed board sensor 62 and a temperature sensor 72 at positions close to the gate 22. The heat partition bath 33 is provided with a printed board sensor 63 and a temperature sensor 73 at positions close to the gate 23. The second intermediate partition bath 34 is provided with a printed board sensor 64 and a temperature sensor 74 at positions close to the gate 24.

Additionally, printed board conveyers 81 through 85 that convey the printed board in the X1 direction are provided for the respective partition baths 31 through 35.

A pump 90 that circulates the inert liquid 13-33 as indicated by an arrow 93, a heater 91 that heats the inert liquid 13-33 with reference to information of a temperature sensor 94, and a cooler 92 that cools the inert liquid 13-33 when it is excessively heated, are provided outside the heat partition bath 33. The inert liquid 13-33 in the heat partition bath 33 is maintained at a soldering temperature Tpeak. The soldering temperature Tpeak is a temperature higher than the melting point of solder by approximately 30° C.: 230° C. in the case of Sn—Ag—Cu solder, and 215° C. in the case of Sn—Pb solder.

A pump 100 that circulates the inert liquid 13-31 as indicated by an arrow 103, a heater 101 that heats the inert liquid 13-31 with reference to information of a temperature sensor 104, and a cooler 102 that cools the inert liquid 13-33 when that is excessively heated are provided outside the input partition bath 21. The inert liquid 13-31 in the input partition bath 21 is maintained at a preheating temperature Tpre1. The preheating temperature Tpre1 is a temperature at which the activation of flux is encouraged, which is 150° C.

A pump 110 that circulates the inert liquid 13-35 as indicated by an arrow 113, a heater 111 that heats the inert liquid 13-35 with reference to information of a temperature sensor 114, and a cooler 112 that cools the inert liquid 13-35 when it is excessively heated are provided outside the removing partition bath 35. The inert liquid 13-35 in the removing partition bath 35 is maintained at a preheating temperature Tpre2. The preheating temperature Tpre2 is 100° C. If the soldered printed board assembly of 230° C. is cooled down to the ambient temperature all at once by being removed to the atmosphere, oxidization of the soldered printed board assembly is apt to be accelerated. However, when the soldered printed board of 230° C. is once cooled down to 100° C. and then cooled down to the ambient temperature by being removed to the atmosphere, the oxidization of the soldered printed board assembly in the atmosphere is controlled. The removing partition bath 35 is provided for controlling the oxidization of the soldered printed board assembly after being removed to the atmosphere.

119 denotes a control box, which is a part of the reflow soldering apparatus 10 and controls the operation of the reflow soldering apparatus. A control unit 120 is provided in the control box 119.

Figure 2:
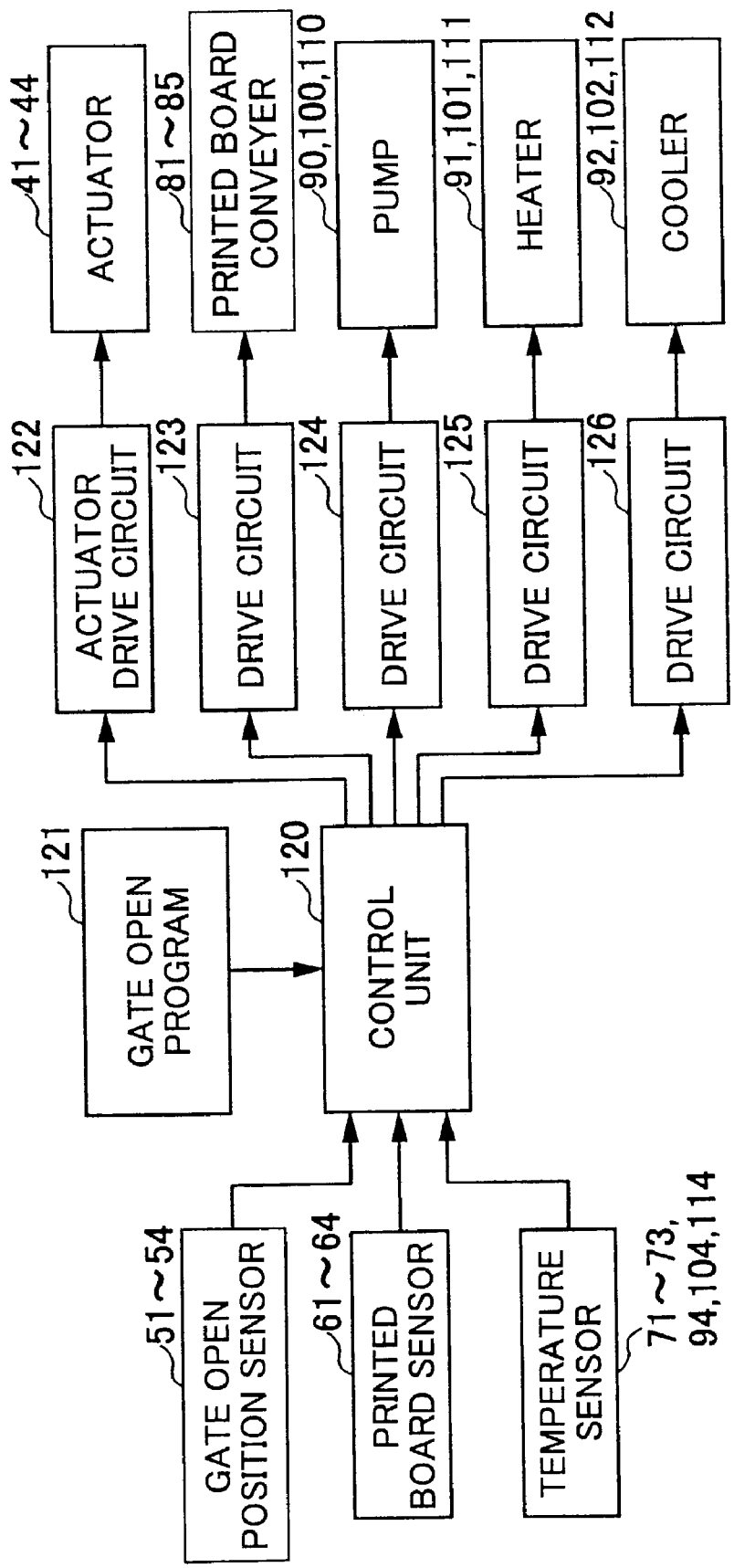
FIG. 2 is a block diagram of a control system of the reflow soldering apparatus in FIG. 1.

FIG. 2 shows the control system of the reflow soldering apparatus 10. In association with the control unit 120, on the side of providing information to the control unit 120, the gate open position sensors 51 through 54, the printed board sensors 61 through 64, the temperature sensors 71 through 74, 94, 104 and 114, and a memory 121 are provided.

The memory 121 stores a program of the opening and closing times and the opening and closing speeds of each of the gates 21 through 24.

A program of an opening operation of the gate 22 is defined based on the result of the following experiment.

A temperature profile is created for each open timing and open speed of the gate 22 by performing again and again an experiment where the reflow soldering apparatus 10 is made to assume the same state as a second stage shown in FIG. 3B, the gate 22 is opened by suitably changing the open timing and the open speed, and the output of the temperature sensor 72 is measured. Among a plurality of the created temperature profiles, a temperature profile that matches line II in FIG. 6 is found. Then, a program of the open timing and the open speed of the gate 22 corresponding to the temperature profile, that is, a program expressed by a line XI in FIG. 5B, is stored in the memory 121.

A program of an open operation of the gate 24 is defined based on the result of the following experiment.

A temperature profile is created for each open timing and open speed of the gate 24 by performing again and again an experiment where the reflow soldering apparatus 10 is made to assume the same state as a fourth stage shown in FIG. 3D, the gate 24 is opened by suitably changing the open timing and the open speed, and the output of the temperature sensor 74 is measured. Among a plurality of the created temperature profiles, a temperature profile that matches line IV in FIG. 6 is found. Then, a program of the open timing and the open speed of the gate 24 corresponding to the temperature profile, that is, a program expressed by a line XII in FIG. 5D, is stored in the memory 121.

On the side of receiving information from the control unit 120, a drive circuit 122 of the actuators 41 through 44, a drive circuit 123 of the printed board conveyers 81 through 85, a drive circuit 124 of the pumps 90, 100 and 110, a drive circuit 125 of the heaters 91, 101 and 111, and a drive circuit 126 of the coolers 92, 102 and 112 are provided.

Next, a description will be given of the operation of the reflow soldering apparatus 10 in reflow soldering the electronic component loaded-printed board assembly 11.

It should be noted that, as shown in FIG. 1, in the electronic component loaded-printed board assembly 11, a surface-mounted electronic component 11*b* having a large heat capacity and a surface-mounted electronic component 11*c* having a small heat capacity are mixed and temporarily mounted on a printed board 11*a* covered with a Sn—Ag—Cu cream solder by using adhesion of the cream solder itself.

The reflow soldering apparatus 10 operates according to the location to which the electronic component loaded-printed board assembly 11 is conveyed, while being controlled by the control unit 120 with respect to the opening and closing of each of the gates 21 through 24.

FIGS. 3A through 3E show the open and close states of the respective gates 21 through 24 in respective positions to which the electronic component loaded-printed board assembly 11 is conveyed, and temperatures of the inert liquids 13-31, 13-32, 13-33, 13-34 and 13-35 in the input partition bath 31, the first intermediate partition bath 32, the heat partition bath 33, the second intermediate partition bath 34 and the removing partition bath 35, respectively. FIG. 4 shows the states shown in FIGS. 3A through 3E in a table. FIGS. 5A through 5D show the open and close states of the gates 21 through 24. FIG. 6 shows a profile of temperature of the electronic component loaded-printed board assembly 11. The profile of temperature is constituted by connecting lines I, II, III, IV and V.

With respect to the single electronic component loaded-printed board assembly 11, the reflow soldering apparatus 10 operates: a first stage shown in FIG. 3A→the second stage as shown in FIG. 3B→a third stage as shown in FIG. 3C→the fourth stage as shown in FIG. 3D→a fifth stage as shown in FIG. 3E.

The profile of temperature in FIG. 6 is constituted by the line I in the first stage, the line II in the second stage, the line III in the third stage, the line IV in the fourth stage, and the line V in the fifth stage.

A state before the electronic component loaded-printed board assembly 11 is put in the input partition bath 31 is:

the same as the following first stage. As shown in FIGS. 3A and 5A through 5D, the gate 21 is OPEN, the gate 22 is CLOSE, the gate 23 is OPEN, the gate 24 is CLOSE, the first intermediate partition bath 32 communicates with the input partition bath 31, and the second intermediate partition bath 34 communicates with the heat partition bath 33. The inert liquids 13-31 and 13-32 of the input partition bath 31 and the first intermediate partition bath 32 are 150° C., the inert liquids 13-33 and 13-34 of the heat partition bath 33 and the second intermediate partition bath 34 are 230° C., and the inert liquid 13-35 in the removing partition bath 35 is 100° C.

The pumps 90, 100 and 110 and the heaters 91, 101 and 111 continue to operate, the inert liquid 13-31 in the input partition bath 31 is maintained at 150° C., the inert liquid 13-33 in the heat partition bath 33 at 230° C., and the inert liquid 13-35 in the removing partition bath 35 at 100° C.

The First Stage:

As shown in FIG. 3A, a first electronic component loaded-printed board assembly 11-1 passes through the carry-in door 15, is conveyed by the printed board conveyer 81 so as to be put into the input partition bath 31, and is immersed in the inert liquid 13-31 and stays therein. The electronic component loaded-printed board assembly 11-1 is heated to the preheating temperature Tpre1 (150° C.) by the inert liquid 13-31, as indicated by the line I in FIG. 6.

Here, since the inert liquid 13 possesses a large heat capacity, when the electronic component loaded-printed board assembly 11-1 is immersed in the inert liquid 13-31, all of the surface-mounting electronic component 11b having the large heat capacity, the surface-mounting electronic component 11c having the small heat capacity, and the printed board 11a are uniformly heated. Thus, the large heat capacity surface-mounting electronic component 11b, the small heat capacity surface-mounting electronic component 11c and the printed board 11a all reach the preheating temperature Tpre1 (150° C.). Also in the other stages, the large heat capacity surface-mounting electronic component 11b, the small heat capacity surface-mounting electronic component 11c and the printed board 11a all reach the temperature that is the same as the temperature of the inert liquid 13.

The Second Stage:

As shown in FIG. 4B, the electronic component loaded-printed board assembly 11-1 is conveyed by the printed board conveyers 81 and 82 in the X1 direction, passes through the gate 21 that is open, moves into the first intermediate partition bath 32, and stays therein while being immersed in the inert liquid 13-32.

When the printed board sensor 62 detects the electronic component loaded-printed board assembly 11-1, first, the actuator 41 is driven, and the gate 21 is closed as shown in FIG. 5A. Subsequently, the actuator 42 is driven, and the gate 22 is opened little by little as represented by the line XI in FIG. 5B. When the gate 22 starts to be opened, the inert liquid 13-33 of 230° C. in the heat partition bath 33 and the inert liquid 13-32 of 150° C. in the first intermediate partition bath 33 start to be mixed. Here, the volume of the first intermediate partition bath 32 is small, approximately ⅕ of the volume of the heat partition bath 33, and the inert liquid 13-33 in the heat partition bath 33 continues to be heated to 230° C. by the heater 91. Hence, the temperature of the inert liquid 13-32 in the first intermediate partition bath 32 starts to be increased from 150° C. and finally reaches approximately 230° C.

With the increase of the temperature of the inert liquid 13-32 in the first intermediate partition bath 32, the temperatures of all of the electronic components 11b and 11c and the printed board 11a are gradually increased as represented by the line II in FIG. 7. In other words, the electronic components 11b and 11c and the printed board Ha are slowly heated in a state where heat stresses hardly occur therein.

The Third Stage:

The printed board conveyers 82 and 83 are driven, and as shown in FIGS. 3B and 3C, the electronic component loaded-printed board assembly 11-1 is conveyed in the X1 direction, passes through the gate 23, and is moved into the heat partition bath 33

After the electronic component loaded-printed board assembly 11-1 is moved into the heat partition bath 33, the actuator 42 is driven, and the gate 22 is closed as shown in FIG. 5B. Then, the actuator 41 is driven, and the gate 21 is opened as shown in FIG. 5A.

The electronic component loaded-printed board assembly 11-1 stays in the inert liquid 13-33 for approximately 90 seconds while being immersed therein. During that time, as represented by the line III in FIG. 7, the electronic components 11b and 11c and the printed board 11a continue to be heated to 230° C. by the inert liquid 13-33, the Sn—Ag—Cu cream solder is melted, and soldering of the electronic components 11b and 11c and the printed board 11a is started. The electronic component loaded-printed board assembly 11-1 becomes a printed board assembly 11A-1.

In addition, since the gate 21 is opened, the first intermediate partition bath 32 communicates with the input partition bath 31, and thus the temperature of the inert liquid 13-32 in the first intermediate partition bath 32 is changed from 230° C. to 150° C.

The Fourth Stage:

The printed board conveyers 83 and 84 are driven, and as shown in FIGS. 3C and 3D, the printed board assembly 11A-1 is conveyed in the X1 direction, passes through the gate 23 that is open, and is moved into the second intermediate partition bath 34.

After the printed board 11A-1 is moved into the second intermediate partition bath 34, the actuator 44 is driven, and the gate 23 is closed as shown in FIG. 5C. Then, the actuator 44 is driven, and the gate 24 is opened little by little as represented by the line XII in FIG. 5D. When the gate 24 starts to be opened, the inert liquid 13-35 of 100° C. in the removing partition bath 35 and the inert liquid 13-34 of 230° C. in the second intermediate partition bath 34 start to be mixed. Here, the volume of the second intermediate partition bath 34 is small, approximately ⅕ of the volume of the removing partition bath 35, and the inert liquid 13-35 in the removing partition bath 35 is maintained at 100° C. by the heater 111 and the cooler 112. Hence, the temperature of the inert liquid 13-34 in the second intermediate partition bath 34 starts to be decreased from 230° C. and finally reaches approximately 100° C.

With the decrease of the temperature of the inert liquid 13-34 in the second intermediate partition bath 34, the temperatures of all of the electronic components 11b and 11c and the printed board 11a gradually decrease as represented by the line IV in FIG. 7. In other words, the melted Sn—Ag—Cu cream solder is solidified, the printed board assembly 11A-1 becomes an electronic component solder mounted printed board assembly 11B-1 in which the electronic components are soldered and mounted to the printed board, and the electronic components 11b and 11c and the printed board 11a are slowly cooled down to 100° C. in a state where heat stresses hardly occur therein.

The Fifth Stage:

The printed board conveyers 84 and 85 are driven, and as shown in FIGS. 3D and 3E, the electronic component solder mounted printed board assembly 11B-1 is conveyed in the X1 direction, passes through the gate 24 that is open, and is moved into the removing partition bath 35.

After the electronic component solder mounted printed board assembly 11B-1 is moved into the removing partition bath 35, the actuator 44 is driven, and the gate 24 is closed as shown in FIG. 5D.

Then, the actuator 43 is driven, the gate 23 is opened as shown in FIG. 5C, the second intermediate partition bath 34 communicates with the heat partition bath 33, and the temperature of the inert liquid 13-34 in the second intermediate partition bath 34 is changed from 100° C. to 230° C.

In addition, the printed board conveyer 85 is driven, and the electronic component solder mounted printed board assembly 11A-2 passes through the carry-out door 16 and is conveyed out to the outside of the reflow soldering apparatus 10.

Further, a second electronic component loaded-printed board assembly 11-2 is put in the input partition bath 31.

Additionally, in the above-described embodiment, in the second stage, the gate 22 is opened little by little as programmed in advance so that the target temperature profile is achieved. However, it is also possible to program the target temperature profile and to adjust such as the opening speed of the gate 22 so that the temperature of the electronic component loaded-printed board assembly 11-1 follows the programmed temperature profile by opening the gate 22 while monitoring the temperature of the electronic component loaded-printed board assembly 11-1.

What is claimed is:

1. A reflow soldering apparatus, comprising:
    a bath apparatus reserving a liquid as a heating medium and divided into a plurality of partition baths by gates, the liquid in one of the partition baths being heated to a preheating temperature, the liquid in another one of the partition baths being heated to a soldering temperature,
    a gate opening part for opening the gates; and
    conveying parts for conveying a printed board assembly in which components are loaded onto a printed board through the partition baths in sequence so as to solder the components to the printed board by a reflow method,
    wherein the gates divide the conveying parts into separate sections for each partition of the bath for a first time period and the gate opening part opens one of the gates for a second time period.

2. A reflow soldering apparatus having a bath apparatus that reserves a liquid as a heating medium and is divided into a plurality of partition baths by gates, the liquid in one of the partition baths being heated to a preheating temperature, the liquid in another one of the partition baths being heated to a soldering temperature, and conveying a printed board assembly in which components are loaded onto a printed board through the partition baths in sequence so as to solder the components to the printed board by a reflow method, comprising:
    a first partition bath reserving the liquid heated to the preheating temperature;
    a second partition bath reserving the liquid heated to the soldering temperature;
    a first gate between the first partition bath and the second partition bath; and
    a first gate opening part gradually opening the first gate before conveying the printed board assembly from the first partition bath to the second partition bath so as to gradually increase a temperature of the liquid in the first partition bath where the printed board assembly is located by mixing the liquid heated to the soldering temperature in the second partition bath therewith.

3. A reflow soldering apparatus having a bath apparatus that reserves a liquid as a heating medium and is divided into a plurality of partition baths by gates, the liquid in one of the partition baths being heated to a preheating temperature, the liquid in another one of the partition baths being heated to a soldering temperature, and conveying a printed board assembly in which components are loaded onto a printed board through the partition baths in sequence so as to solder the components to the printed board by a reflow method, comprising:
    a first partition bath reserving the liquid heated to the preheating temperature;
    a second partition bath reserving the liquid heated to the soldering temperature;
    a third partition bath reserving the liquid heated to the soldering temperature;
    a fourth partition bath reserving the liquid heated to a pre-cooling temperature;
    a first gate between the first partition bath and the second partition bath;
    a second gate between the second partition bath and the third partition bath;
    a third gate between the third partition bath and the fourth partition bath;
    a gate opening part gradually opening the first gate before conveying the printed board assembly from the first partition bath to the second partition bath so as to gradually increase a temperature of the liquid in the first partition bath where the printed board assembly is located by mixing the liquid heated to the soldering temperature in the second partition bath therewith; and
    a gate opening part gradually opening the third gate before conveying the printed board assembly from the third partition bath to the fourth partition bath so as to gradually decrease the temperature of the liquid in the third partition bath, in a state where the printed board assembly is conveyed via the second partition bath to and is located in the third partition bath, by mixing the liquid heated to a second preheating temperature in the fourth partition bath therewith.

4. The reflow soldering apparatus as claimed in claim 2 or 3, wherein the second bath includes a heater that continues to heat the liquid reserved therein to the soldering temperature.

5. The reflow soldering apparatus as claimed in claim 2 or 3, wherein the second bath includes a heater that continues to heat the liquid reserved therein, and the second bath has a volume several times larger than the first bath.

6. A reflow soldering apparatus, comprising:
a bath apparatus reserving a liquid as a heating medium and including an input partition bath, a first intermediate partition bath, a heat partition bath, a second intermediate partition bath, and a removing partition bath that are divided by gates and arranged sequentially in a direction in which a printed board assembly where components are loaded onto a printed board moves;
a conveyer conveying the board loading the components in an order of the input partition bath, the first intermediate partition bath, the heat partition bath, the second intermediate partition bath, and the removing partition bath;
a heater provided for the heat partition bath and continuing to heat the liquid in the heat partition bath to a soldering temperature; a heater provided for the input partition bath and continuing to heat the liquid in the input partition bath to a preheating temperature;
a heater provided for the removing partition bath and continuing to heat the liquid in the removing partition bath to a pre-cooling temperature;
a gate opening part gradually opening a gate between the first intermediate partition bath and the heat partition bath before conveying the printed board assembly into the heat partition bath so as to gradually increase a temperature of the liquid in the first intermediate partition bath, in a state where the printed board assembly put in the input partition bath is conveyed into the first intermediate partition bath, by mixing the liquid heated to the soldering temperature in the heat partition bath therewith; and
a gate opening part gradually opening a gate between the second intermediate partition bath and the removing partition bath before conveying the printed board assembly from the second intermediate partition bath to the removing partition bath so as to gradually decrease the temperature of the liquid in the second intermediate partition bath, in a state where the printed board assembly is conveyed via the heat partition bath to and is located in the second intermediate partition bath, by mixing the liquid heated to the pre-cooling temperature in the removing partition bath therewith.

7. The reflow soldering apparatus as claimed in claim 6, wherein the heat partition bath has a volume several times larger than the first intermediate partition bath, and the removing partition bath has a volume several times larger than the second intermediate partition bath.

8. A reflow soldering method soldering components to a printed board by a reflow method through using a bath apparatus that reserves a liquid as a heating medium and is divided into a plurality of baths by gates, the liquid in one of the baths being heated to a preheating temperature, the liquid in another one of the baths being heated to a soldering temperature, and through sequentially conveying a printed board assembly where the components are loaded onto the printed board through the plurality of baths,
wherein, before the printed board assembly is conveyed from the bath that reserves the liquid heated to the preheating temperature to the bath that reserves the liquid heated to the soldering temperature, the gate is gradually opened so as to increase a temperature of the liquid in the bath where the printed board assembly is located by mixing the liquid heated to the soldering temperature therewith.

9. A reflow soldering method soldering components to a printed board by a reflow method through using a bath apparatus that reserves a liquid as a heating medium and is divided into a plurality of baths by gates, the liquid in one of the baths being heated to a preheating temperature, the liquid in another one of the baths being heated to a soldering temperature, and through sequentially conveying a printed board assembly where the components are loaded onto the printed board through the plurality of baths, comprising the steps of:
immersing the printed board loading the components in the liquid heated to the preheating temperature in a first bath;
gradually opening the gate between the first bath and a second bath so that a temperature of the liquid in the first bath is gradually increased through mixing the liquid heated to the soldering temperature in the second bath with the liquid in the first bath, in a state where the printed board assembly is immersed in the liquid in the first bath; and
conveying the printed board assembly into the second bath after the temperature of the liquid in the first bath is increased and keeping the printed board assembly located therein.

10. A reflow soldering method soldering components to a printed board by a reflow method through using a bath apparatus that reserves a liquid as a heating medium and is divided into a plurality of baths by gates, the liquid in one of the baths being heated to a preheating temperature, the liquid in another one of the baths being heated to a soldering temperature, and through sequentially conveying a printed board assembly where the components are loaded onto the printed board through the plurality of baths, comprising the steps of:
immersing the printed board assembly in the liquid heated to the preheating temperature in a first bath;
gradually opening the gate between the first bath and a second bath so that a temperature of the liquid in the first bath is gradually increased by mixing the liquid heated to the soldering temperature in the second bath and the liquid in the first bath, in a state where the printed board assembly is immersed in the liquid in the first bath;
conveying the printed board assembly into the second bath after the temperature of the liquid in the first bath is increased and keeping the printed board assembly located therein; conveying the printed board assembly located in the second bath to a third bath that reserves the liquid heated to the soldering temperature; and
gradually opening the gate between the third bath and a fourth bath so that the temperature of the liquid in the third bath is gradually decreased by mixing the liquid in the third bath with the liquid in the fourth bath, in a state where the printed board assembly is immersed in the liquid in the third bath.

* * * * *